US008675777B2

(12) United States Patent
Pan

(10) Patent No.: US 8,675,777 B2
(45) Date of Patent: Mar. 18, 2014

(54) PROGRAMMABLE IF FREQUENCY FILTER FOR ENABLING A COMPROMISE BETWEEN DC OFFSET REJECTION AND IMAGE REJECTION

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 866 days.

(21) Appl. No.: 12/544,486

(22) Filed: Aug. 20, 2009

(65) Prior Publication Data
US 2010/0015939 A1 Jan. 21, 2010

Related U.S. Application Data

(63) Continuation-in-part of application No. 10/865,951, filed on Jun. 14, 2004, now Pat. No. 7,596,195, which is a continuation-in-part of application No. 10/813,270, filed on Mar. 31, 2004, now Pat. No. 7,603,098, application No. 12/544,486, which is a continuation of application No. 10/840,271, filed on May 7, 2004, now Pat. No. 7,603,085, which is a continuation-in-part of application No. 10/813,270, filed on Mar. 31, 2004, now Pat. No. 7,603,098.

(51) Int. Cl.
*H04L 25/06* (2006.01)
*H03D 1/00* (2006.01)

(52) U.S. Cl.
USPC ................. 375/319; 375/339; 375/236

(58) Field of Classification Search
USPC ........... 375/240.28–240.29, 229–236, 319, 375/350, 354, 355, 359, 219, 220, 222, 375/240.26–240.29, 295, 296, 297, 316, 375/318, 338, 339, 340, 344, 346, 317
See application file for complete search history.

(56) References Cited

U.S. PATENT DOCUMENTS

| | | | |
|---|---|---|---|
| 4,724,407 A | 2/1988 | Miura et al. |
| 4,857,778 A | 8/1989 | Hague |
| 4,866,779 A | 9/1989 | Kennedy et al. |
| 4,914,408 A | 4/1990 | Voorman |
| 4,928,315 A | 5/1990 | Jensen et al. |
| 4,965,853 A | 10/1990 | Barnard |
| 5,028,893 A | 7/1991 | Marrah et al. |
| 5,140,703 A | 8/1992 | Payne |
| 5,285,502 A | 2/1994 | Walton et al. |
| 5,307,372 A | 4/1994 | Sawyer et al. |

(Continued)

FOREIGN PATENT DOCUMENTS

| | | |
|---|---|---|
| DE | 32 23 904 A1 | 12/1983 |
| EP | 0 542 520 A2 | 5/1993 |
| EP | 0 797 292 A1 | 9/1997 |
| EP | 0 948 128 A1 | 10/1999 |

OTHER PUBLICATIONS

EP Search Report, dated Jul. 26, 2005 for EP Patent Application No. EP05004477.5, 3 pages.

(Continued)

*Primary Examiner* — Sam K Ahn
*Assistant Examiner* — Linda Wong
(74) *Attorney, Agent, or Firm* — Sterne, Kessler, Goldstein & Fox P.L.L.C.

(57) ABSTRACT

A center frequency of an adjustable filter is controlled to achieve a compromise between DC offset rejection and image rejection.

24 Claims, 13 Drawing Sheets

(56) References Cited

U.S. PATENT DOCUMENTS

| | | |
|---|---|---|
| 5,535,283 A | 7/1996 | Saruta et al. |
| 5,629,655 A | 5/1997 | Dent |
| 5,726,974 A | 3/1998 | Kunieda et al. |
| 5,933,448 A | 8/1999 | Katisko |
| 6,055,282 A | 4/2000 | Hughes et al. |
| 6,226,509 B1 * | 5/2001 | Mole et al. .................... 455/302 |
| 6,262,563 B1 * | 7/2001 | Champlin .................... 320/134 |
| 6,370,370 B1 | 4/2002 | Roth et al. |
| 6,437,639 B1 | 8/2002 | Nguyen et al. |
| 6,441,682 B1 | 8/2002 | Vinn et al. |
| 6,445,735 B1 | 9/2002 | Whikehart |
| 6,559,740 B1 | 5/2003 | Schulz |
| 6,577,855 B1 | 6/2003 | Moore et al. |
| 6,628,891 B1 * | 9/2003 | Vantalon et al. ............. 386/255 |
| 6,633,550 B1 | 10/2003 | Gardenfors et al. |
| 6,892,060 B2 | 5/2005 | Zheng |
| 6,917,252 B1 | 7/2005 | Wyszynski |
| 7,050,778 B1 * | 5/2006 | Olson .......................... 455/296 |
| 7,098,731 B1 * | 8/2006 | Wyszynski .................... 327/557 |
| 7,120,416 B2 | 10/2006 | Tomita |
| 7,138,873 B2 | 11/2006 | Chandra et al. |
| 7,171,185 B2 | 1/2007 | Matsumoto et al. |
| 7,203,466 B2 * | 4/2007 | Muschallik et al. ............ 455/86 |
| 7,224,722 B2 * | 5/2007 | Shi et al. ....................... 375/219 |
| 7,376,409 B2 | 5/2008 | Pan |
| 7,596,195 B2 | 9/2009 | Pan |
| 7,603,085 B2 | 10/2009 | Pan |
| 7,603,098 B2 | 10/2009 | Pan |
| 8,116,706 B1 * | 2/2012 | Clement et al. ............ 455/179.1 |
| 2001/0001759 A1 | 5/2001 | Holden et al. |
| 2002/0071173 A1 | 6/2002 | Lee et al. |
| 2002/0094037 A1 | 7/2002 | Darabi et al. |
| 2002/0115420 A1 | 8/2002 | Cheng |
| 2003/0008628 A1 * | 1/2003 | Lindell et al. .............. 455/180.1 |
| 2003/0016761 A1 | 1/2003 | Min |
| 2003/0017817 A1 | 1/2003 | Cowley |
| 2003/0064695 A1 | 4/2003 | Shi |
| 2003/0165203 A1 | 9/2003 | Mohindra |
| 2004/0002311 A1 | 1/2004 | Feng |
| 2004/0097212 A1 * | 5/2004 | Matsumoto et al. .......... 455/296 |
| 2004/0202196 A1 * | 10/2004 | Sindhushayana et al. .... 370/465 |
| 2004/0213366 A1 | 10/2004 | Ono ............................. 375/348 |
| 2004/0247046 A1 * | 12/2004 | Hsiao ........................... 375/319 |
| 2004/0247132 A1 | 12/2004 | Klayman et al. |
| 2004/0266369 A1 | 12/2004 | McCallister |
| 2005/0118975 A1 | 6/2005 | Ismail |
| 2005/0220223 A1 | 10/2005 | Pan |
| 2005/0221783 A1 | 10/2005 | Pan |
| 2005/0221788 A1 | 10/2005 | Pan |
| 2005/0221789 A1 | 10/2005 | Pan |
| 2006/0153403 A1 | 7/2006 | Lechner |

OTHER PUBLICATIONS

EP Search Report, dated Jul. 13, 2005 for EpPPatent Application No. EP05009151.1, 3 pages.

* cited by examiner

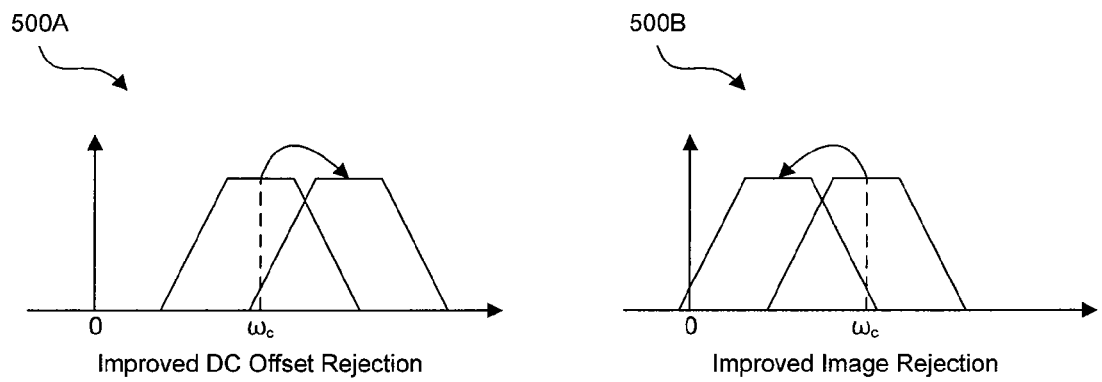
FIG. 5A
FIG. 5B
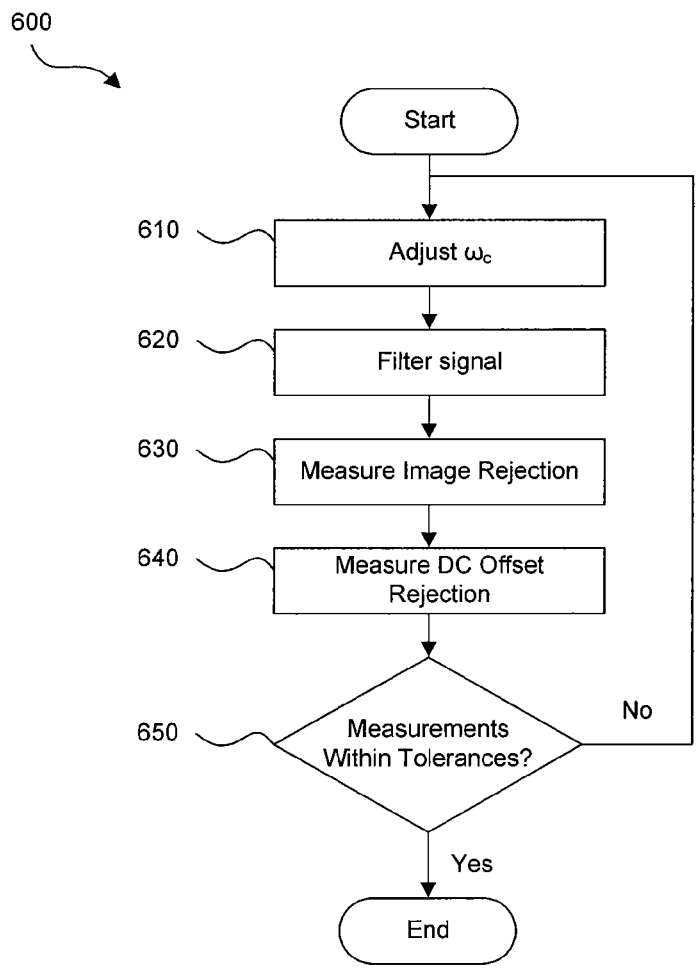
FIG. 6

If Wlo> Wrf => Wif=Wlo-Wrf >0

Need complex IF filter with center >0

If Wlo<Wrf => Wif=Wlo-Wrf <0

Need complex IF filter with center >0

IQ_select=1
Center=Wc
Wif>0

IQ_select=0₁
Center=-Wc
Wif<0

PROGRAMMABLE IF FREQUENCY FILTER FOR ENABLING A COMPROMISE BETWEEN DC OFFSET REJECTION AND IMAGE REJECTION

CROSS REFERENCE TO RELATED APPLICATIONS

This application is a continuation-in-part of U.S. patent application Ser. No. 10/865,951, filed Jun. 14, 2004, now U.S. Pat. No. 7,596,195, which is a continuation-in-part of U.S. patent application Ser. No. 10/813,270, filed Mar. 31, 2004, now U.S. Pat. No. 7,603,098, all of which are incorporated herein by reference in their entirety.

This application is also a continuation-in-part of U.S. patent application Ser. No. 10/840,271, filed May 7, 2004, now U.S. Pat. No. 7,603,085, which is a continuation-in-part of U.S. patent application Ser. No. 10/813,270, filed Mar. 31, 2004, now U.S. Pat. No. 7,603,098, all of which are incorporated herein by reference in their entirety.

BACKGROUND

1. Field of the Invention

This invention relates generally to wireless communication systems, and more particularly, but not exclusively, to a programmable IF frequency filter that enables a compromise between DC offset rejection and image rejection.

2. Related Art

Communication systems are known to support wireless and wire line communications between wireless and/or wire line communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

However, two issues complicate the selection of an RF receiver IF frequency: DC offset rejection and image rejection. Increasing the IF frequency will improve DC offset rejection while decreasing the IF frequency will improve image rejection.

Accordingly, a new circuit and method is required that enables a compromise between DC offset rejection and image rejection.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

FIG. 5A and FIG. 5B are charts illustrating shifting the IF frequency of the channel select filter (bandpass filter) to overcome DC offset rejection and image rejection, respectively;

FIG. 6 is a flowchart illustrating a method for IF frequency selection according to an embodiment of the invention;

Figure 1:
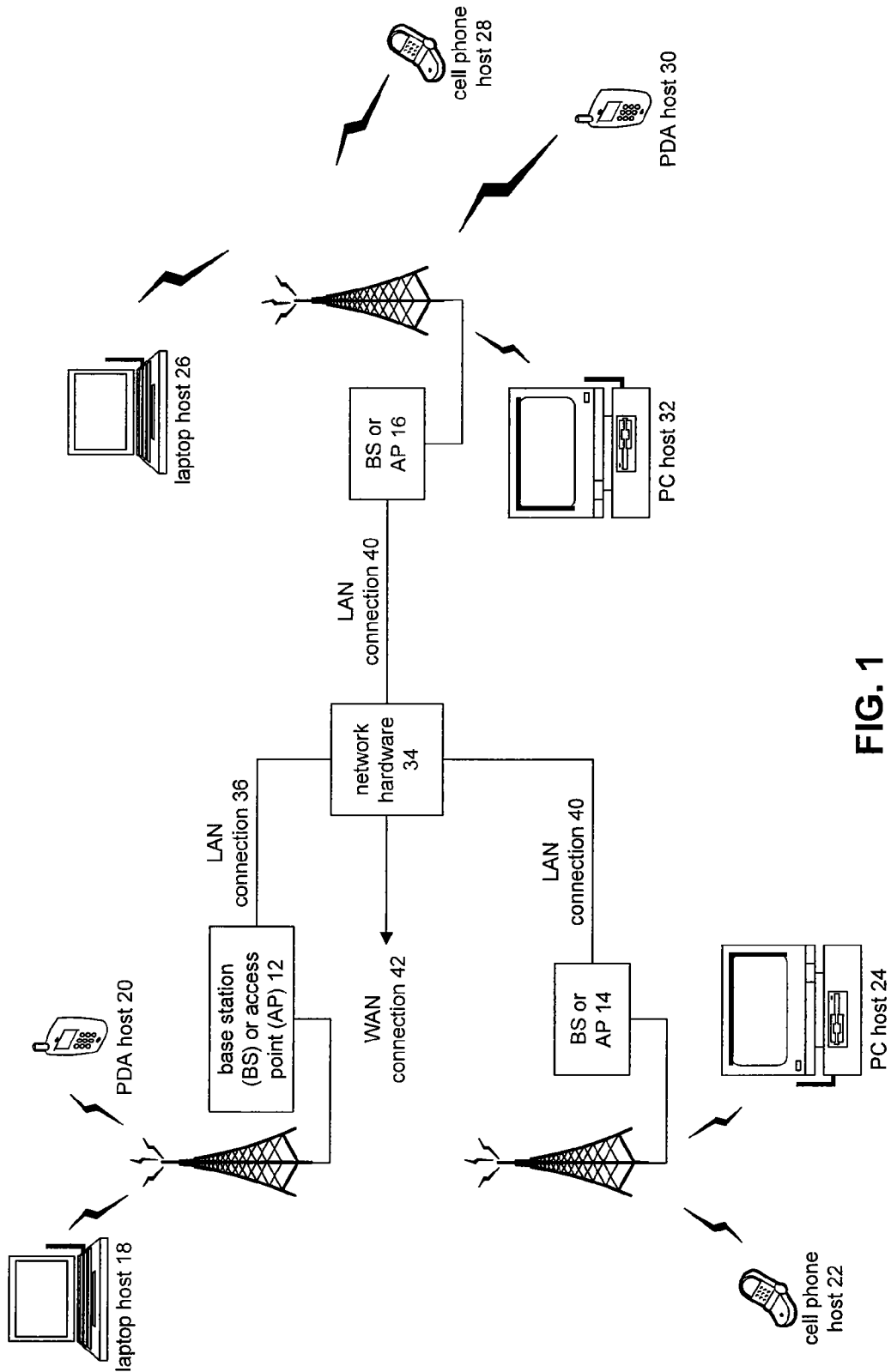
FIG. 1 is a block diagram illustrating a network system according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s).

The example embodiments described herein are provided for illustrative purposes, and are not limiting. Further structural and operational embodiments, including modifications/alterations, will become apparent to persons skilled in the relevant art(s) from the teachings herein.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area.

Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

Figure 2:
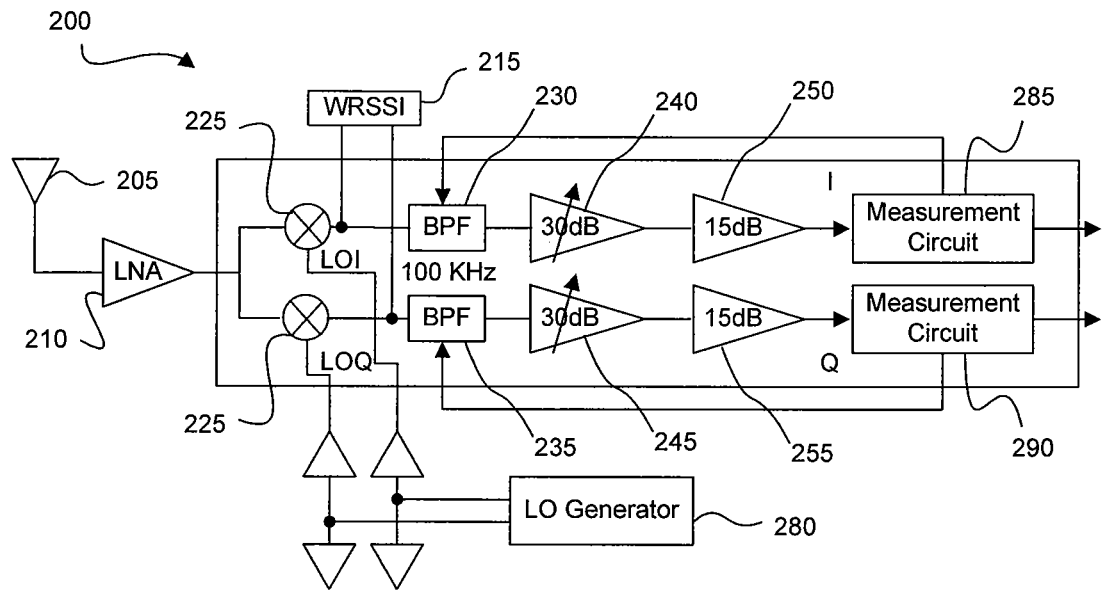
FIG. 2 is a circuit diagram illustrating a receiver.

FIG. 2 is a circuit diagram illustrating a receiver 200 with low-intermediate frequency, which is 100 KHz in this embodiment. An antenna 205 is coupled to a low noise amplifier (LNA) 210, which is coupled to down converters (mixers) 220 and 225. The down converters 220 and 225 are coupled to bandpass filters (BPFs) 230 and 235, respectively, which are coupled to programmable gain stages 240 and 245, respectively. The gain stages 240 and 245 are coupled to gain stages 250 and 255 respectively, which output analog signals to measurement circuits 285 and 290, respectively. Further, an LO generator 280 is coupled to the down converters 220 and 225. A wideband radio signal strength indicator (WRSSI) 215 is coupled to connections between the down converters 220 and 225 and the bandpass filters 230 and 235.

The antenna 205 receives signals and passes the signals to the LNA 210, which amplifies the received signals and passes them to the down converters 220 and 225, which shifts the frequency of the received signals downwards. The BPFs 230 and 235 discriminate against unwanted frequencies outside of a selected band. The BPFs 230 and 235 also perform channel selection to compromise between image rejection and DC offset rejection, as will be discussed in further detail below.

In an embodiment of the invention, each BPF 230 and 235 can comprise 3 biquads with configurations as shown in Table I below.

TABLE I

| (Center Frequency of 100 KHz) | | | |
|---|---|---|---|
| | Biquad1 | Biquad2 | Biquad3 |
| Center Frequency | 100 KHz | 186 KHz | 13.4 KHz |
| BW | 200 KHz | 100 KHz | 100 KHz |
| Q | 0.5 | 1.866 | 0.134 |
| Gain Setting | 20 dB, 0 dB | 10 dB, 0 dB | 0 dB |
| 30 dB | 20 dB | 10 dB | 0 dB |
| 20 dB | 20 dB | 0 dB | 0 dB |
| 10 dB | 0 dB | 10 dB | 0 dB |
| 0 dB | 0 dB | 0 dB | 0 dB |
| Current | 1.7 mA (I and Q) | 1.7 mA (I and Q) | 1.7 mA (I and Q) |

Each BPF 230 and 235 can have gain settings of 30 dB, 20 dB, 10 dB and 0 dB. IF can be centered at 112 KHz, 108 KHz, 104 KHz, and 100 KHz. Further, the BPFs 230 and 235 can change the IQ polarity.

Control words will vary the coupling resistor 410 values, which is Rx in FIG. 4, and change the IF frequency of the channel select filter 400. Control words for changing the channel selection (frequency selection) of the BPFs 230 and 235 are shown in Table II below.

TABLE II

| BPF Center Frequency | Center Frequency Control Word (4 bit) |
|---|---|
| 112 KHz | 1000 |
| 108 KHz | 0100 |
| 104 KHz | 0010 |
| 100 KHz | 0001 |

The LO generator 280 determines how to bring an incoming RF signal received at the antenna 205 down to 100 KHz. The gain stages 240-255 increase the gain of the BPFs 230 and 235 output. The measurement circuits 285 and 290 measure the DC offset rejection and image rejection of the filtered signals and provide feedback to the BPFs 230 and 235 so that a new IF frequency can be chosen to form a better compromise between DC offset rejection and image rejection.

Figure 3:
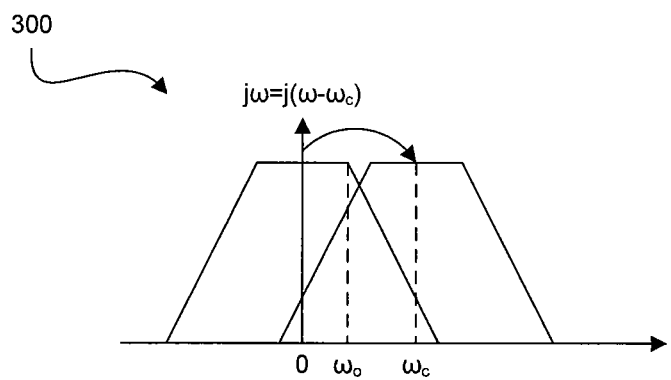
FIG. 3 is a chart illustrating an IF frequency shift to transform a low pass filter into a bandpass filter.

FIG. 3 is a chart illustrating an IF frequency shift 300 to transform a low pass filter into a bandpass filter. The transformation can be done by the variation of resistance in the BPFs 230 and 235 as derived below based on the circuits shown in FIG. 4A and FIG. 4B below. The transformation also enables IF frequency shifting to compensate for DC offset rejection and image rejection.

For a low pass filter:

$$\frac{y}{x} = \frac{Gain}{1 + j\frac{\omega}{\omega_0}},$$

wherein $\omega_0$ is the corner frequency.

For a bandpass filter:

$$\frac{y}{x} = \frac{Gain}{1 + j\frac{(\omega - \omega_c)}{\omega_0}},$$

wherein $\omega_C$ is the center frequency.

Therefore, for the channel select filter electrical equivalent 420 (FIG. 4B):

$$\frac{y}{x} = \frac{1}{j\frac{\omega}{\omega_0} + 1 - j2Q}$$

$$= \frac{1}{1 + j\left(\frac{\omega}{\omega_0} - 2Q\right)}$$

$$= \frac{1}{1 + j\frac{\omega - 2Q\omega_0}{\omega_0}}$$

$$= \frac{1}{1 + j\frac{\omega - \omega_c}{\omega_0}}.$$

Therefore, $$\omega_0 = \frac{1}{R_f C},$$

$$\omega_C = \frac{1}{R_x C},$$

and $$Q = \frac{\omega_c}{2\omega_0}.$$

Figure 4A:
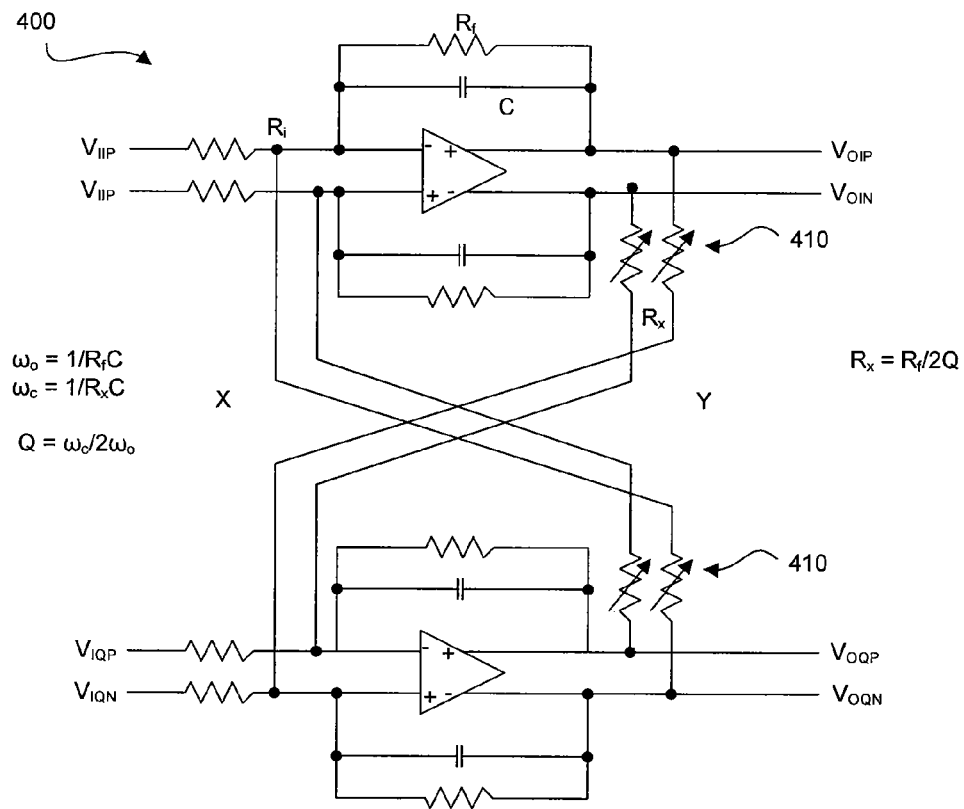
FIGS. 4A and 4B are diagrams illustrating a channel select filter (bandpass filter) of the receiver IF section of FIG. 2 and its electrical equivalent, respectively.
Figure 4B:
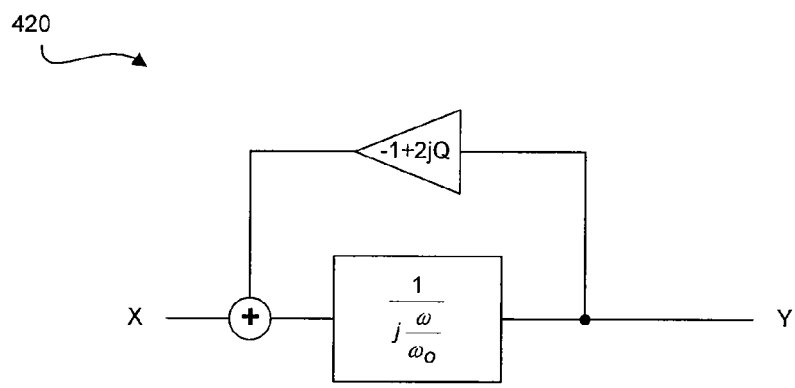

FIG. 4A and FIG. 4B are diagrams illustrating a channel select filter 400 (e.g., bandpass filters 230 and 235) and its electrical equivalent, respectively. The filter 400 is an active RC filter that enables achievement of a high dynamic range. The filter 400 comprises two cross coupled low pass filters having cross coupled variable resistors 410, each having a resistance $R_X$. As derived above, variation of $R_X$ shifts the bandpass filter IF frequency up or down. Specifically, the IF frequency of the filter 400 is inversely proportional to $R_X$.

During operation of the filter 400, a signal is filtered by the filter 400 with the resistors 410 set to an initial default value. The filtered signals are then transmitted to the measurement circuits 285 and 290 where image rejection and DC offset rejection are measured. The circuits 285 and 290 provide feedback to the resistors 410, which are then adjusted and the measurements repeated after filtering again. This process is repeated until a compromise is established between DC offset rejection and image rejection (e.g., wherein image rejection meets minimum pre-specified requirements and the DC offset rejection is within acceptable tolerances).

FIG. 5A and FIG. 5B are charts 500A and 500B illustrating shifting the IF frequency of the channel select filter 400 (e.g., bandpass filters 230 and 235) to overcome DC offset rejection and image rejection, respectively. During the operation of the filter 400, the IF frequency of the filter 400 is shifted upwards to improve DC offset rejection (as shown in FIG. 5A) and downwards to improve image rejection (as shown in FIG. 5B) until a compromise is reached.

FIG. 6 is a flowchart illustrating a method 600 for IF frequency selection according to an embodiment of the invention. The IF receiver section 200 may implement the method 600. First, the IF center frequency is adjusted (610) by varying resistance of the resistors 410. A received signal is then filtered (620) using a bandpass filter using the adjusted frequency. Image rejection and DC offset rejection of the filtered signal is then measured (630, 640). It is then determined (650) if the measurements are within a specific tolerance (e.g., DC offset rejection is within acceptable tolerances and image rejection meet minimum pre-specified requirements). If the measurements are within the tolerances, the method 600 ends. Otherwise, the center frequency is then adjusted (610) again and the method 600 repeats.

Figure 7A:
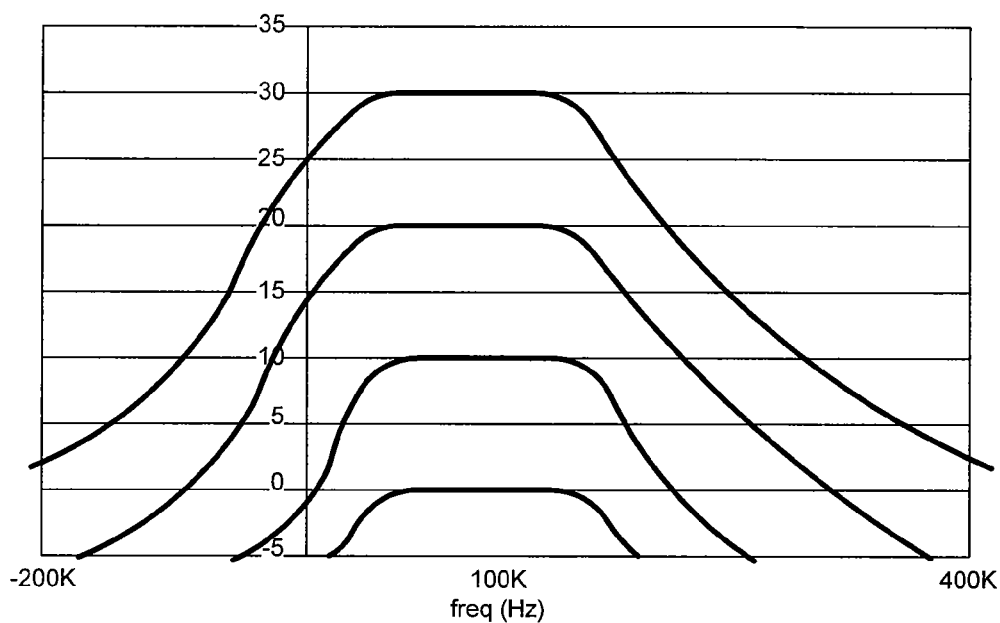
FIG. 7A and FIG. 7B are charts illustrating a variable gain in the bandpass filter of the receiver of FIG. 2 and corresponding noise figures.

Control words also vary $R_f$ and $R_i$ (FIG. 8A) values to change the gain of the bandpass filter 230 and 235. As shown in FIG. 7A, in an embodiment of the invention, the BPFs 230 and 235 can have variable gain from 0 db to 30 db in 10 db steps. Control words for the varying gain are shown in Table III below. It will be appreciated by one of ordinary skill in the art that the gain settings are not limited to the values shown in Table III.

TABLE III

| Gain | Gain Control Word (2 bit) | Noise Figure @ 100 KHz |
|---|---|---|
| 30 db | 11 | 18.9 |
| 20 db | 10 | 21 |
| 10 db | 01 | 39 |
| 0 db | 00 | 41 |

Figure 8A:
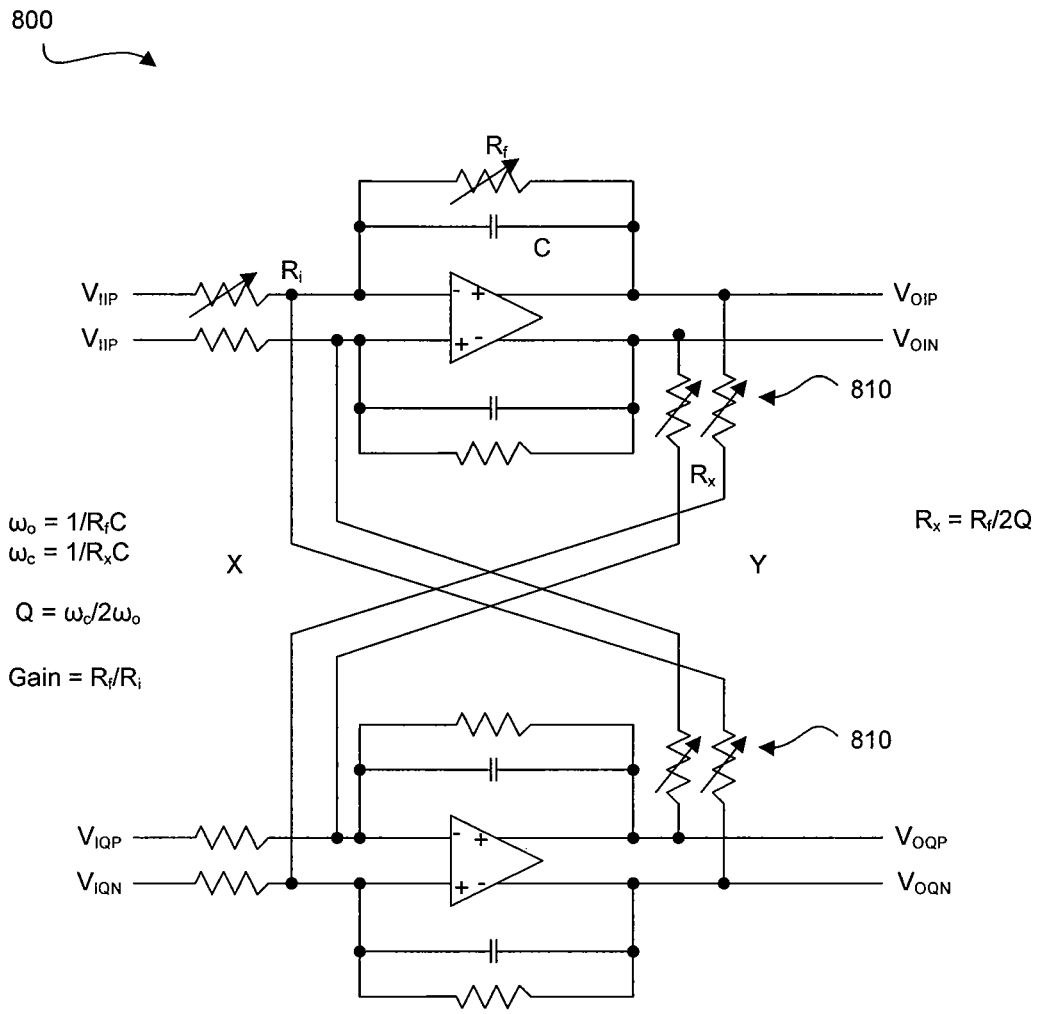
FIGS. 8A and 8B are diagrams illustrating a channel select filter (bandpass filter) of the receiver IF section of FIG. 2 and its electrical equivalent, respectively.

The LO generator 280 determines how to bring an incoming RF signal received at the antenna 205 down to 100 KHz. The PGAs 240 and 245 increase the gain of the BPFs 230 and 235 output. The baseband digital processing circuits 285 and 290 convert analog signals from the PGAs 240 and 245 to digital data and determine if the current gain is adequate (e.g., if signal to noise ratio too low). The baseband digital processing circuits 285 and 290 then adjust the BPF 230 and 235 gain function accordingly by varying $R_f$ and $R_i$ (FIG. 8A). In an embodiment of the invention, the receiver 200 can include measurement circuits (not shown) in place of or in addition to the baseband digital processing circuits 285 and 290 that measure the DC offset rejection and image rejection of the filtered signals and provide feedback to the BPFs 230 and 235 so that a new IF frequency can be chosen to form a better compromise between DC offset rejection and image rejection.

FIG. 7A is a chart illustrating variable gain in the bandpass filter of the receiver of FIG. 2. Gain can be varied by the variation of resistance in the BPFs 230 and 235 as derived below based on the circuits shown in FIG. 8A and FIG. 8B below. Resistance variation (for resistors 810 in FIG. 8A) also enables IF frequency shifting to compensate for DC offset rejection and image rejection.
For a low pass filter:

$$\frac{y}{x} = \frac{\text{Gain}}{1 + j\frac{\omega}{\omega_0}},$$

wherein $\omega_0$ is the corner frequency.
For a bandpass filter:

$$\frac{y}{x} = \frac{\text{Gain}}{1 + j\frac{(\omega - \omega_c)}{\omega_0}},$$

wherein $\omega_C$ is the center frequency.
Therefore, for the channel select filter electrical equivalent 820 (FIG. 8B):

$$\frac{y}{x} = \frac{\text{Gain}}{j\frac{\omega}{\omega_0} + 1 - j2Q}$$

$$= \frac{\text{Gain}}{1 + j\left(\frac{\omega}{\omega_0} - 2Q\right)}$$

$$= \frac{\text{Gain}}{1 + j\frac{\omega - 2Q\omega_0}{\omega_0}}$$

$$= \frac{\text{Gain}}{1 + j\frac{\omega - \omega_c}{\omega_0}}.$$

Therefore, $$\omega_0 = \frac{1}{R_f C},$$

$$\omega_C = \frac{1}{R_x C},$$

and $$Q = \frac{\omega_c}{2\omega_o}.$$

Figure 7B:
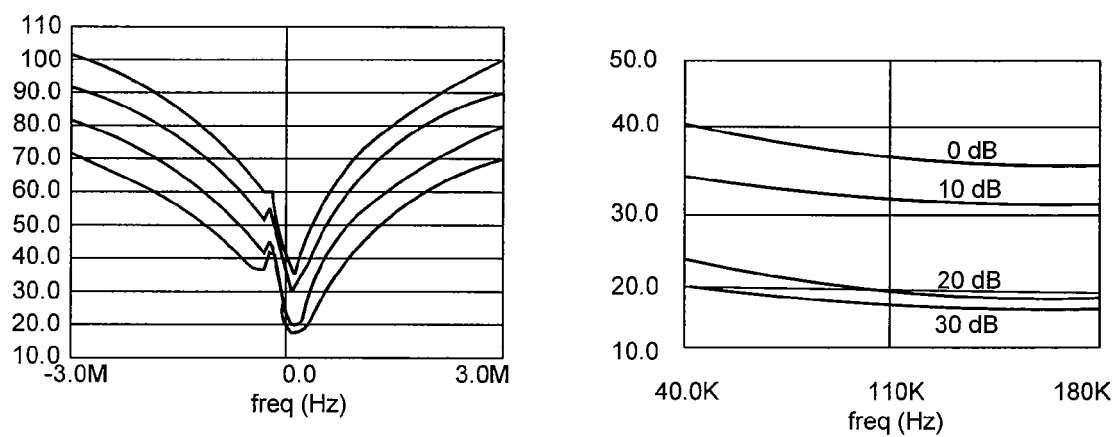

FIG. 7B are charts showing noise figures for the BPFs 230 and 235. As gain is increased, noise decreases, thereby improving the signal to noise ratio.

Figure 8B:
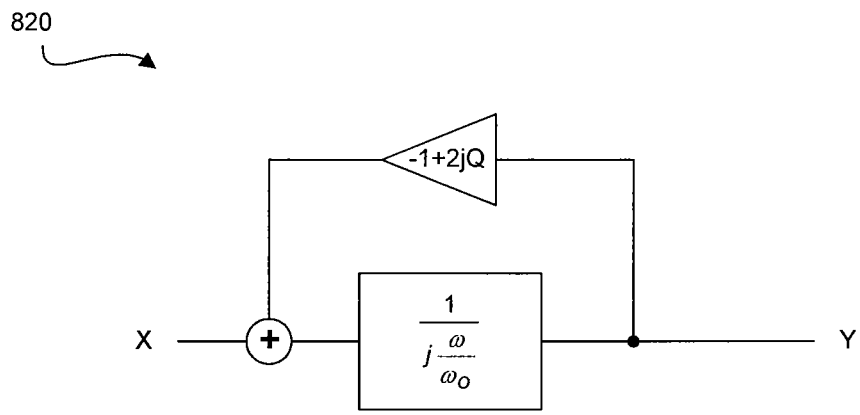

FIG. 8A and FIG. 8B are diagrams illustrating a BPF 800 (e.g., the bandpass filters 230 and 235) and its electrical equivalent 820, respectively. The filter 800 is an active RC filter that enables achievement of a high dynamic range. The filter 800 comprises two cross coupled low pass filters having cross coupled variable resistors 810, each having a resistance $R_X$. As derived above, variation of $R_X$ shifts the bandpass filter IF frequency up or down. Specifically, the IF frequency of the filter 800 is inversely proportional to $R_X$. In addition, variation of a feedback resistor, $R_f$, and of an input resistor, $R_i$, enable changes in gain of the filter 800 as gain is equal to $$\frac{R_f}{R_i}.$$

$R_f$ and $R_i$ are set to default values (e.g., zero gain) initially and gain, if any, is applied. After filtering and amplification (by the PGAs 240, 245), the baseband digital processing circuits 285 and 290 determine if the gain is adequate based on the signal to noise ratio. If the gain is insufficient because of BPF 230 or 235 noise is being amplified, then the baseband digital processing circuits 285 and 290 provide feedback to the BPFs 230 and 235 and $R_f$ and $R_i$ are adjusted to increase gain in the BPFs 230 and 235.

Figure 9:
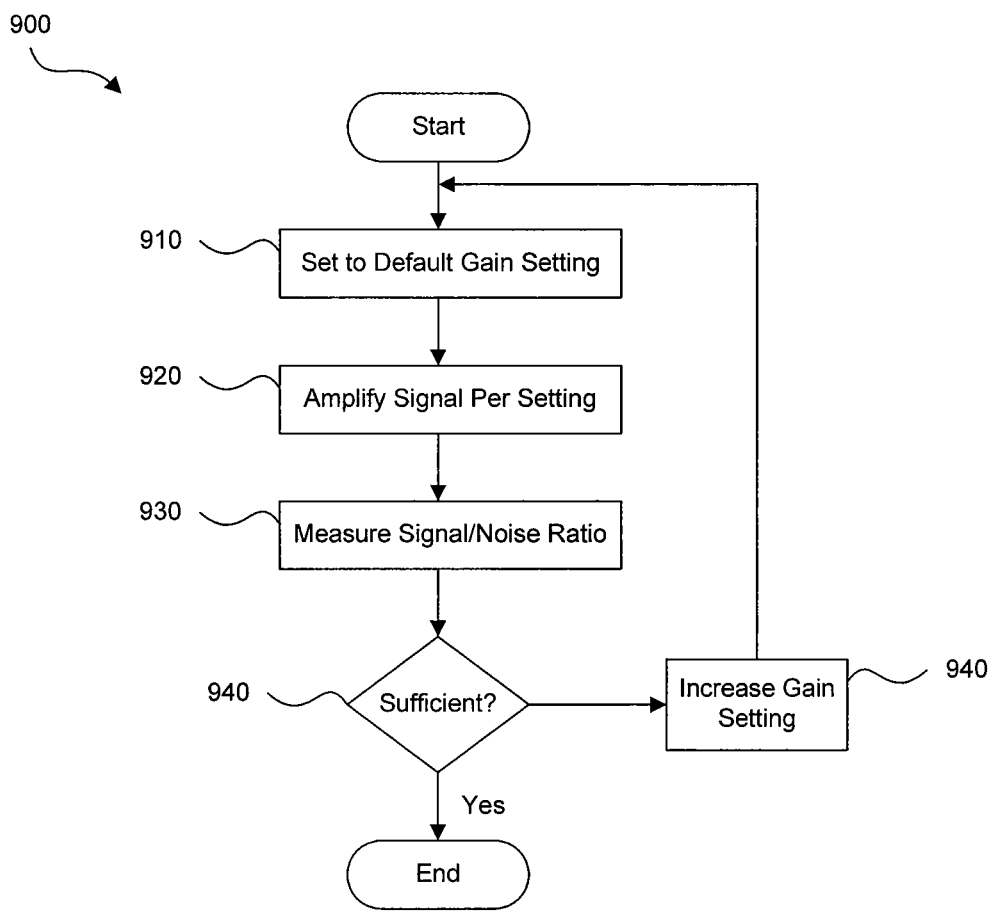
FIG. 9 is a flowchart illustrating a method for variable gain selection in the filter.

FIG. 9 is a flowchart illustrating a method 900 for variable gain selection in the filter 800. In an embodiment of the invention, the filter 800 (e.g., the BPFs 230 and 235) and the baseband digital processing circuits 285 and 290 perform the method 900. First, gain in the filter 800 is set (910) to a default setting (e.g., 0 by setting $R_f$ and $R_i$ to be equal to each other). Next, the signal is amplified (920) according to the setting. The signal to noise ratio is then measured (930). If (940) it is determined that the gain is sufficient because the signal to noise ratio is sufficient, the method 900 then ends. Otherwise, the gain setting is adjusted (950) upwards and the amplifying (920), measuring (930), and determining (940) are repeated until the signal to noise ratio is adequate.

In an embodiment of the invention, the measuring (930) can determine if the gain is appropriate (too high or too low) and the adjusting (950) can adjust the gain up or down accordingly.

Further, the BPFs 230 and 235 can change the IQ polarity, as will be discussed further below. Control words for changing IQ polarity are shown in Table IV below.

TABLE IV

| (Control Words for IQ Polarity) | | |
|---|---|---|
| IQ_select | IQ Polarity | BPF Shape |
| 1 | I = I, Q = Q | Wif = 100 KHz |
| 0 | I = I, Q = Qbar | Wif = −100 KHz |

Figure 11:
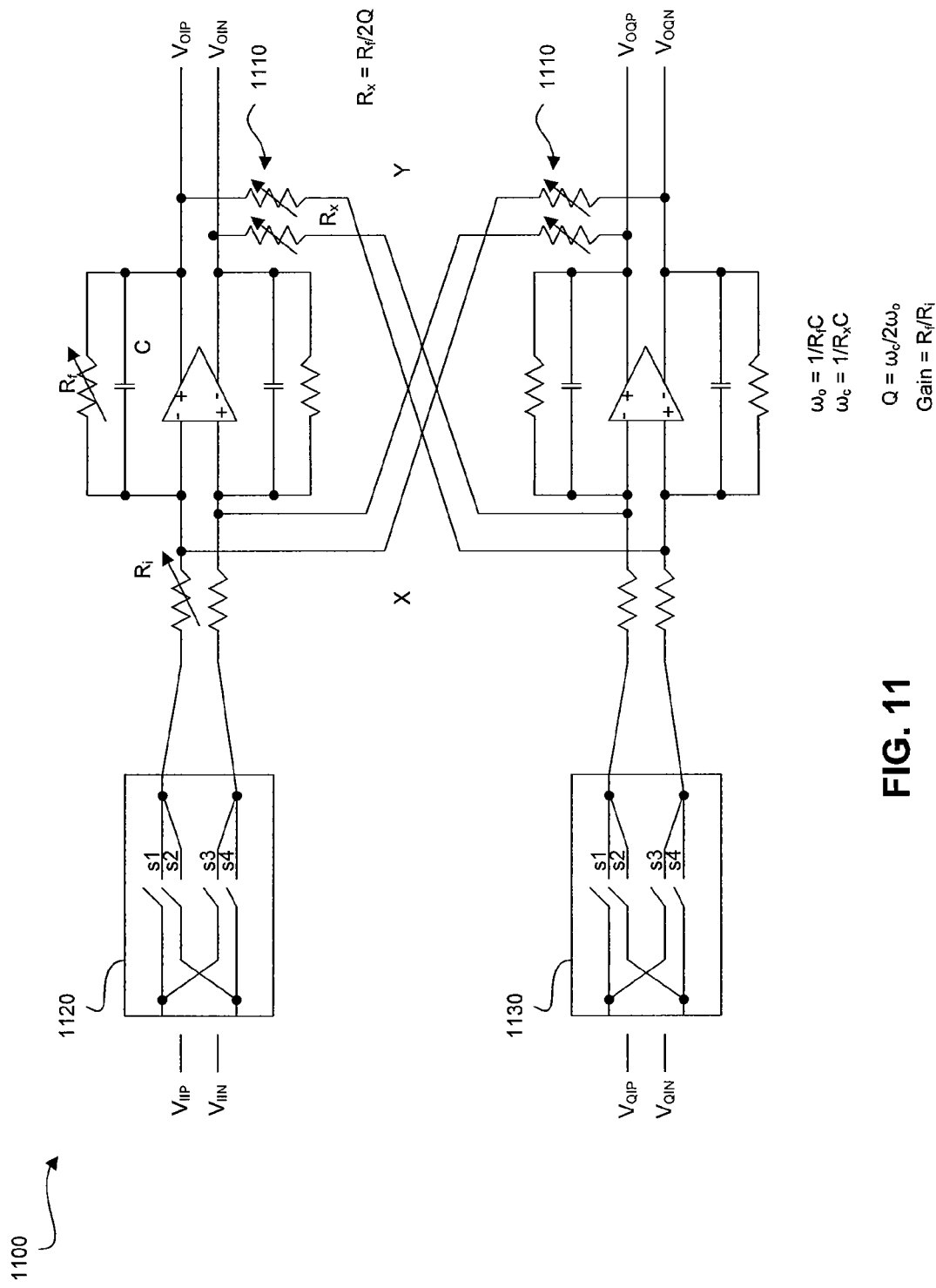
FIG. 11 is a diagram illustrating a channel select filter (bandpass filter) of the receiver IF section of FIG. 2.

The LO generator 280 determines how to bring an incoming RF signal received at the antenna 205 down to 100 KHz. The PGAs 240 and 245 increase the gain of the BPFs 230 and 235 output. The baseband digital processing circuits 285 and 290 convert analog signals from the PGAs 240 and 245 to digital data and determine if the current gain is adequate (e.g., if signal to noise ratio too low). The baseband digital processing circuits 285 and 290 then adjust the BPF 230 and 235 gain function accordingly by varying $R_f$ and $R_i$ (FIG. 11). In an embodiment of the invention, the receiver 200 can include measurement circuits (not shown) in place of or in addition to the baseband digital processing circuits 285 and 290 that measure the DC offset rejection and image rejection of the filtered signals and provide feedback to the BPFs 230 and 235 so that a new IF frequency can be chosen to form a better compromise between DC offset rejection and image rejection.

Figure 10A:
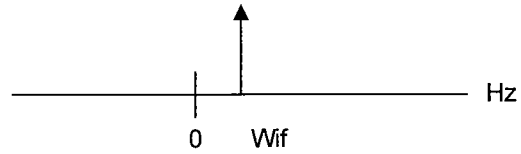
FIG. 10A-10D are diagrams illustrating BPF center frequency based on down conversion frequency.
Figure 10B:
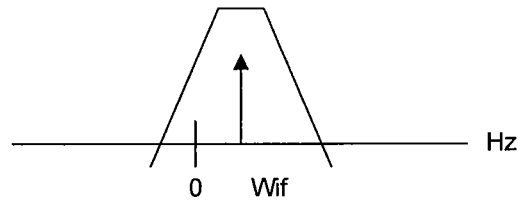
Figure 10C:
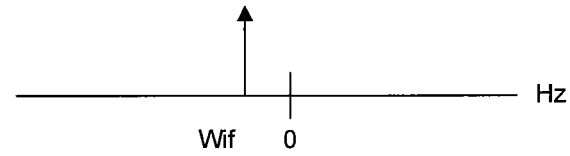
Figure 10D:
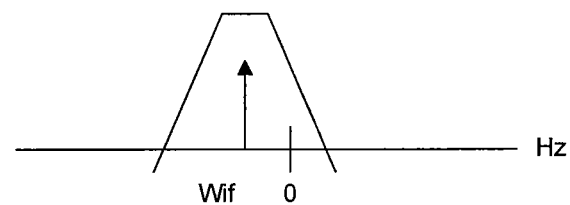

FIG. 10A-10D are diagrams illustrating BPF center frequency based on down conversion frequency. As shown in FIG. 10A, when Wlo (LO frequency) is greater than Wrf (received frequency), Wif=Wlo−Wro will be positive. Accordingly, a BPF with a positive center frequency will be required to filter Wif. Further, as shown in FIG. 10C, when Wlo<Wrf, then Wif=Wlo−Wrf will be negative, necessitating the need for a BPF with a negative center frequency.

For a low pass filter:

$$\frac{y}{x} = \frac{\text{Gain}}{1 + j\frac{\omega}{\omega_0}},$$

wherein $\omega_0$ is the corner frequency.

For a bandpass filter:

$$\frac{y}{x} = \frac{\text{Gain}}{1 + j\frac{(\omega - \omega_c)}{\omega_0}},$$

wherein $\omega_C$ is the center frequency.

For the channel select filter electrical equivalent 1300 (FIG. 13A):

$$\frac{y}{x} = \frac{\text{Gain}}{j\frac{\omega}{\omega_0} + 1 - j2Q}$$

$$= \frac{\text{Gain}}{1 + j\left(\frac{\omega}{\omega_0} - 2Q\right)}$$

$$= \frac{\text{Gain}}{1 + j\frac{\omega - 2Q\omega_0}{\omega_0}}$$

$$= \frac{\text{Gain}}{1 + j\frac{\omega - \omega_c}{\omega_0}},$$

where $$\omega_0 = \frac{1}{R_f C},$$

$$\omega_C = \frac{1}{R_x C},$$

$$Q = \frac{\omega_c}{2\omega_o},$$

and $$\text{Gain} = \frac{R_f}{R_i}.$$

In contrast, for the channel select filter equivalent 1500 (FIG. 15A):

$$\frac{y}{x} = \frac{\text{Gain}}{j\frac{\omega}{\omega_0} + 1 + j2Q}$$

$$= \frac{\text{Gain}}{1 + j\left(\frac{\omega}{\omega_0} + 2Q\right)}$$

$$= \frac{\text{Gain}}{1 + j\frac{\omega + 2Q\omega_0}{\omega_0}}$$

$$= \frac{\text{Gain}}{1 + j\frac{\omega + \omega_c}{\omega_0}},$$

where $$\omega_0 = \frac{1}{R_f C},$$

$$\omega_C = -\frac{1}{R_x C},$$

$$Q = \frac{\omega_c}{2\omega_o},$$

$$\text{Gain} = \frac{R_f}{R_i},$$

and $$\frac{y}{x} = \frac{\text{Gain}}{1 + j\frac{(\omega + \omega_c)}{\omega_0}}.$$

The filter 1100 is an active RC filter that enables achievement of a high dynamic range. The filter 1100 comprises two cross coupled low pass filters having cross coupled variable resistors 410, each having a resistance $R_X$. As derived above, variation of $R_X$ shifts the bandpass filter IF frequency up or down. Specifically, the IF frequency of the filter 1100 is inversely proportional to $R_X$. In addition, variation of a feedback resistor, $R_f$, and of an input resistor, $R_i$, enable changes in gain of the filter 1100 as gain is equal to $$\frac{R_f}{R_i}.$$

$R_f$ and $R_i$ are set to default values (e.g., zero gain) initially and gain, if any, is applied. After filtering and amplification (by the PGAs 240, 245), the baseband digital processing circuits 285 and 290 determine if the gain is adequate based on the signal to noise ratio. If the gain is insufficient because of BPF 230 or 235 noise is being amplified, then the baseband digital processing circuits 285 and 290 provide feedback to the BPFs 230 and 235 and $R_f$ and $R_i$ are adjusted to increase gain in the BPFs 230 and 235.

In order to reverse polarities to move the BPF 1100 center frequency from positive to negative, the BPF 1100 includes switching devices 1120 and 1130. The switching device 1120 is coupled to the inputs of a first LPF that is a cross-coupled to a second LPF to form the BPF 1100. The switching device 1130 is coupled to the second LPF. In an embodiment of the invention, the BPF 1100 does not include the switching device 1120. Each switching device 1120 and 1130 include 4 (four) switches s1-s4. Switches s2 and s3 of each switching device 1120 and 1130 enable the cross-coupling of inputs while the switches s1 and s4 enable straight input without cross-coupling. Specifically, the switches s2 and s3 of the switching device 1120 reverse the inputs of $V_{IIP}$ and $V_{IIN}$, while the switches s2 and s3 of the switching device 1130 reverse the inputs of $V_{QIP}$ and $V_{QIN}$.

Figure 12A:
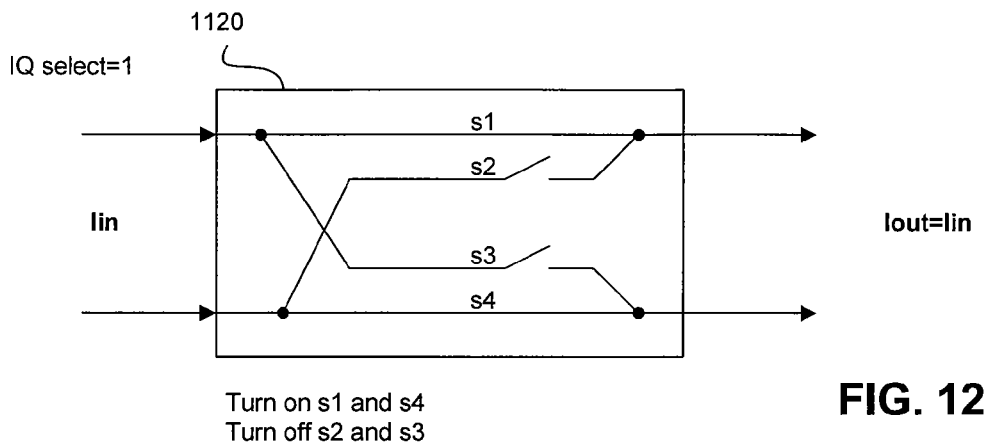
FIGS. 12A and 12B are diagrams illustrating the switching devices of the BPF when polarity is not reversed.
Figure 12B:
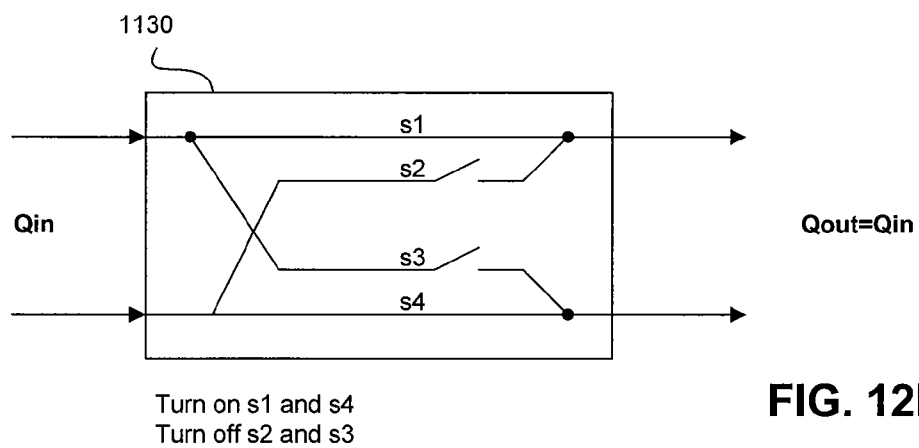

FIGS. 12A and 12B are diagrams illustrating the switching devices 1120 and 1130 of the BPF 1100 when polarity is not reversed (i.e., IQ_select=1). When polarity is not reversed (e.g., the BPF 1100 center frequency is positive), the switches s1 and s4 of both the switching devices 1120 and 1130 are activated to enable straight pass through of signals to the BPF 1100 with no cross-coupling. Accordingly, $I_{out}=I_{in}$ and $Q_{out}=Q_{in}$.

Figure 13A:
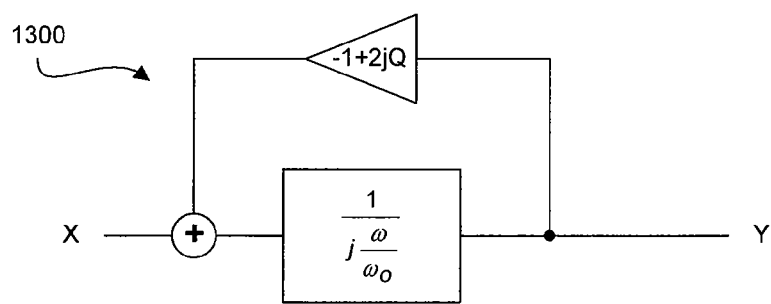
FIGS. 13A and 13B are diagrams illustrating a signal flow diagram of the BPF without reversed polarity and the center frequency of the BPF.
Figure 13B:
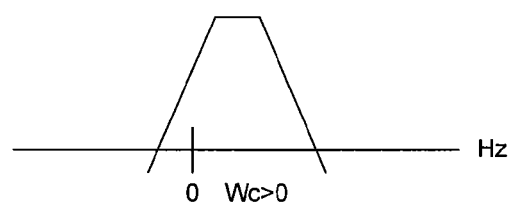

FIGS. 13A and 13B are diagrams illustrating a signal flow diagram of the BPF 1100 without reversed polarity and the center frequency of the BPF. When IQ_select=1, the signal flow diagram of the BPF 1100 becomes the circuit 1300 as shown in FIG. 13A. Therefore, the center frequency of the BPF is positive, as shown in FIG. 13B.

Figure 14A:
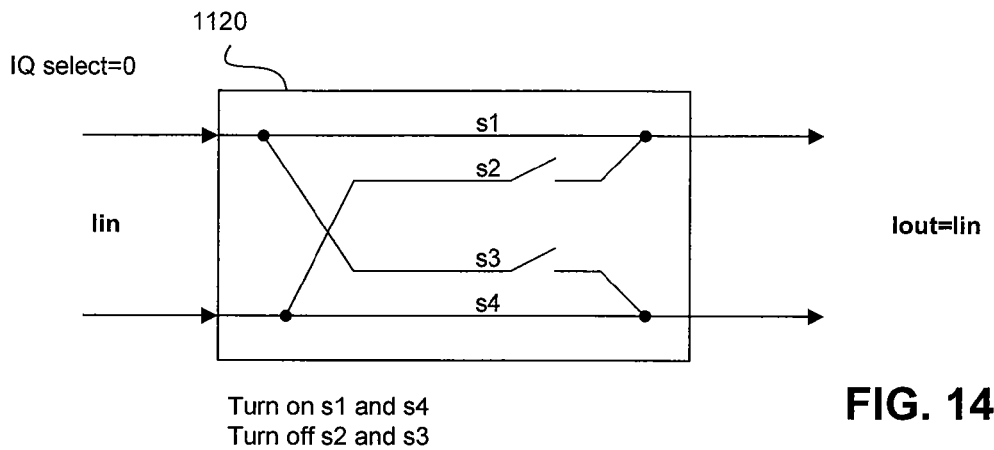
FIGS. 14A and 14B are diagrams illustrating the switching devices of the BPF when polarity is not reversed.
Figure 14B:
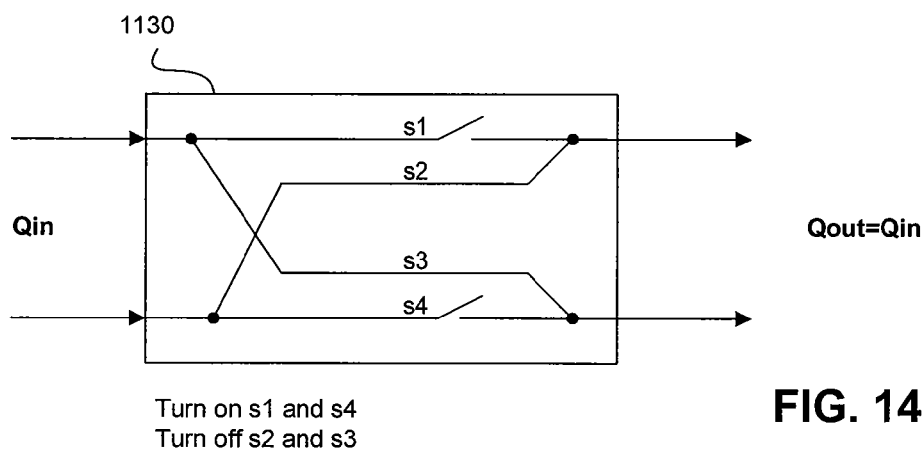

FIGS. 14A and 14B are diagrams illustrating the switching devices 1120 and 1130 of the BPF 1100 when polarity is reversed (i.e., IQ_select=0). When polarity is reversed (e.g., the BPF 1100 center frequency is negative), the switches s1 and s4 of the switching devices 1120 are activated to enable straight pass through of signals to the BPF 1100 with no cross-coupling. However, the switches s2 and s3 of the switching device 1130 is activated to enabling cross-coupling, thereby reversing the inputs of Qin. Accordingly, $I_{out}=I_{in}$ and $Q_{out}=-Q_{in}$.

Figure 15A:
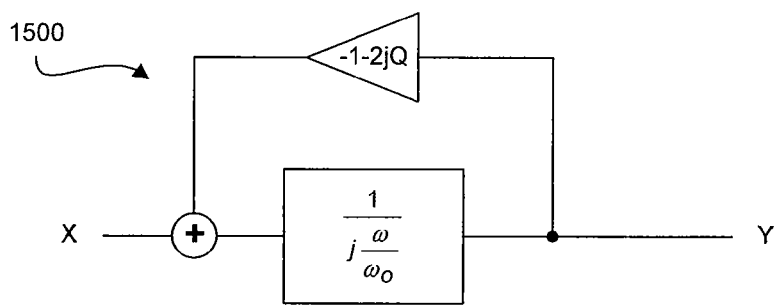
FIGS. 15A and 15B are diagrams illustrating a signal flow diagram of the BPF without reversed polarity and the center frequency of the BPF.
Figure 15B:
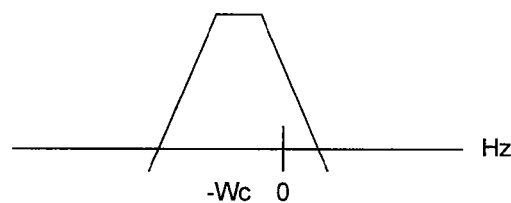

FIGS. 15A and 15B are diagrams illustrating a signal flow diagram of the BPF 1100 with reversed polarity and the center frequency of the BPF. When IQ_select=0, the signal flow diagram of the BPF 1100 becomes the circuit 1500 as shown in FIG. 15A. Therefore, the center frequency of the BPF is negative, as shown in FIG. 15B.

Figure 16A:
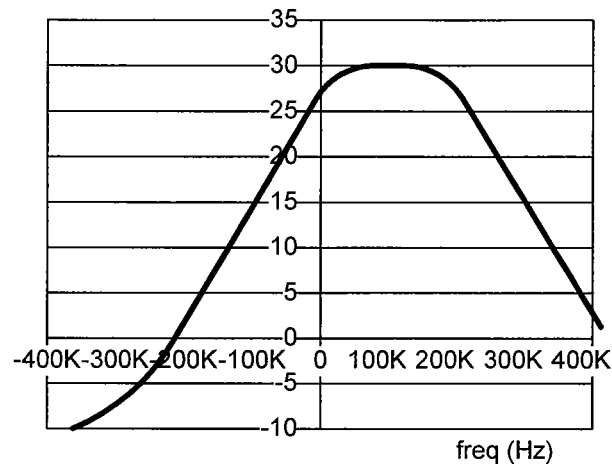
FIGS. 16A and 16B are simulation charts illustrating the center frequency of the BPF without and with reversed polarity, respectively.
Figure 16B:
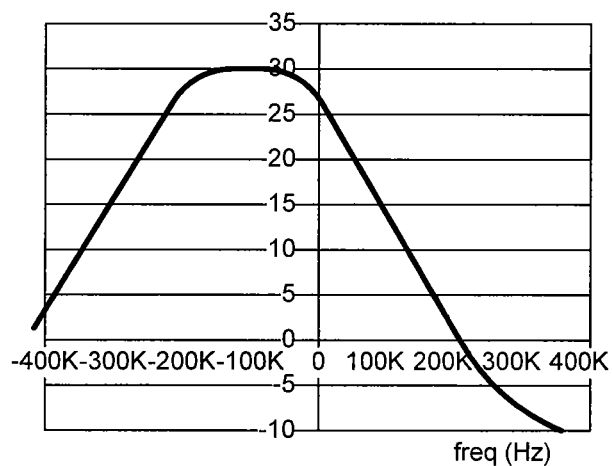

FIGS. 16A and 16B are simulation charts illustrating the center frequency of the BPF 1100 without and with reversed polarity, respectively. When IQ_select=1 (high side injection), the center frequency of the BPF 1100 is positive, as shown in FIG. 16A. When IQ_select=0 (low side injection), the center frequency of the BPF 1100 is negative, as shown in FIG. 16B. Accordingly, the BPF 1100 can perform filtering for either high side or low side injection.

Figure 17:
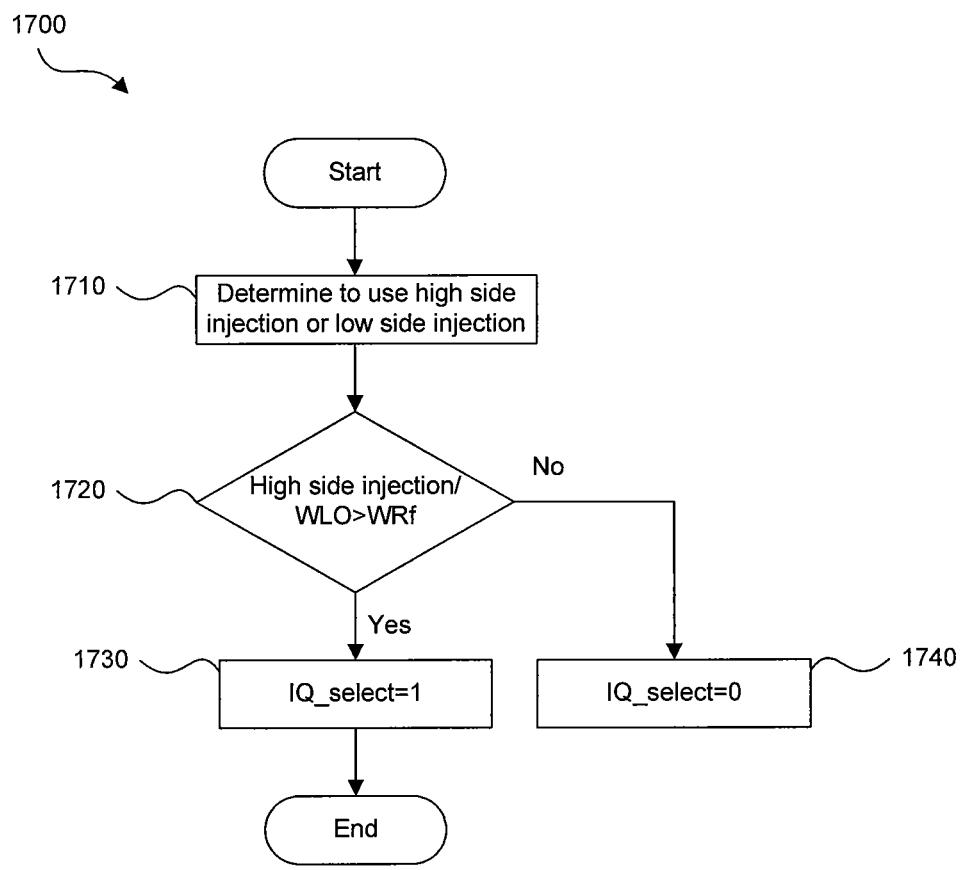
FIG. 17 is a flowchart illustrating a method of changing a center frequency of a BPF by reversing polarity.

FIG. 17 is a flowchart illustrating a method 1700 of changing a center frequency of a BPF by reversing polarity. First, a heterodyne receiver determines (1710) to use either high side injection or low side injection. If (1720) high injection is used then Wlo is set to be higher than the Wrf, and then Wif will be greater than 0. Accordingly IQ_select is set (1730) to 1 to center the BPF at a positive frequency. Else if low injection is used then Wlo is set to be lower than the Wrf, and then Wif will be less than 0. Accordingly, IQ_select is set (1740) to 0 to center the BPF at negative frequency. The method 1700 then ends.

CONCLUSION

While various embodiments of the present invention have been described above, it should be understood that they have been presented by way of example, and not limitation. It will be apparent to persons skilled in the relevant art(s) that various changes in form and detail may be made therein without departing from the spirit and scope of the invention. Thus the present invention should not be limited by any of the above-described exemplary embodiments, but should be defined only in accordance with the following claims and their equivalents.

What is claimed is:

1. An apparatus, comprising;
   an adjustable filter configured to filter a communication signal to provide a filtered communication signal, the adjustable filter being characterized by a center frequency; and
   a digital processing circuit configured to measure an image rejection and a DC offset rejection of the filtered communication signal and to cause the adjustable filter to adjust the center frequency from a first center frequency to a second center frequency such that the image rejection and the DC offset rejection are at respective compromise positions to thereby optimize the image rejection and the DC, offset rejection of the filtered communication signal.

2. The apparatus of claim 1, wherein the compromise position is reached when the DC offset rejection is within acceptable tolerances and the image rejection meets minimum pre-specified requirements.

3. The apparatus of claim 1, wherein the first center frequency is less than the second center frequency, an adjustment of the center frequency from the first center frequency to the second center frequency causing an increase in the DC offset rejection and a decrease in the image rejection.

4. The apparatus of claim 1, wherein the first center frequency is greater than the second center frequency, an adjustment of the center frequency from the first center frequency to the second center frequency causing a decrease in the DC offset rejection and an increase in the image rejection.

5. The apparatus of claim 1, wherein the digital processing circuit is further configured to change a control word from a first value to a second value to cause the adjustable filter to adjust the center frequency from the first center frequency to the second center frequency.

6. The apparatus of claim 1, further comprising:
   a mixer configured to downconvert the communication signal to the first center frequency based upon a first local oscillator (LO) signal, the image rejection and the DC offset rejection being unoptimized when the center frequency is at the first center frequency.

7. The apparatus of claim 1, wherein the adjustable filter comprises:
   a first cross coupled low pass filter including a first cross coupled variable resistor; and
   a second cross coupled low pass filter including a second cross coupled variable resistor,
   wherein the digital processing circuit is configured to cause the adjustable filter to adjust the first cross coupled variable resistor and the second cross coupled variable resistor to adjust the center frequency from the first center frequency to the second center frequency.

8. The apparatus of claim 1, wherein at least one of a the first cross coupled low pass filter and the second cross coupled low pass filter comprises:
   an active low pass filter.

9. The apparatus of claim 1, wherein the adjustable filter is further characterized by a gain, and wherein the digital processing circuit is further configured to measure a signal to noise ratio of the filtered communication signal, and to cause the adjustable filter to adjust its respective gain until the signal to noise ratio is sufficient to allow for measurement of the image rejection and the DC offset rejection of the filtered communication signal.

10. The apparatus of claim 9, wherein the adjustable filter comprises:
    a first cross coupled low pass filter including a first variable feedback resistor; and a second cross coupled low pass filter including a second variable feedback resistor, wherein the digital processing circuit is configured to cause the adjustable filter to adjust the first variable feedback resistor and the second variable feedback resistor to adjust the gain.

11. The apparatus of claim 10, wherein at least one of a the first cross coupled low pass filter and the second cross coupled low pass filter comprises:

an active low pass filter.

12. The apparatus of claim 1, wherein the adjustable filter is further configured to receive the communication signal from a wireless communication channel.

13. A method, comprising:

filtering a communication signal to provide a filtered communication signal using an adjustable filter;

measuring an image rejection and a DC offset rejection of the filtered communication signal; and causing a center frequency of the adjustable filter to adjust from a first center frequency to a second center frequency to reach a compromise between the DC offset rejection and the image rejection to thereby optimize the image rejection and the DC offset rejection of the filtered communication signal.

14. The method of claim 13, wherein causing comprises:

causing the adjustable filter to adjust the center frequency from the first center frequency to the second center frequency such that the DC offset rejection is within acceptable tolerances and the image rejection meets minimum pre-specified requirements.

15. The method of claim 13, wherein causing comprises:

causing the adjustable filter to adjust the center frequency from the first center frequency to the second center frequency, the first center frequency being less than the second center frequency, the adjustment of the center frequency from the first center frequency to the second center frequency causing an increase in the DC offset rejection and a decrease in the image rejection.

16. The method of claim 13, wherein causing comprises:

causing the adjustable filter to adjust the center frequency from the first center frequency to the second center frequency, the first center frequency being greater than the second center frequency, the adjustment of the center frequency from the first center frequency to the second center frequency causing a decrease in the DC offset rejection and an increase in the image rejection.

17. The method of claim 13, wherein causing comprises:

changing a control word from a first value to a second value to cause the adjustable filter to adjust the center frequency from the first center frequency to the second center frequency.

18. The method of claim 13, further comprising:

downconverting the communication signal to the first center frequency based upon a first local oscillator (LO) signal, the image rejection and the DC offset rejection being unoptimized when the center frequency is at the first center frequency.

19. The method of claim 13, wherein filtering comprises:

filtering the communication signal using a first cross coupled low pass filter aril a second cross coupled low pass filter, the first cross coupled low pass filter including a first cross coupled variable resistor and the second cross coupled low pass filter including a second cross coupled variable resistor.

20. The method of claim 13, wherein causing comprises:

causing the adjustable filter to adjust the first cross coupled variable resistor and the second cross coupled variable resistor to adjust the center frequency from the first center frequency to the second center frequency.

21. The method of claim 13, wherein the adjustable filter is further characterized by a gain, and further comprising:

measuring a signal to noise ratio of the filtered communication signal; and causing the adjustable filter to adjust the gain until the signal to noise ratio is sufficient to allow for measurement of the image rejection and the DC offset rejection of the filtered communication signal.

22. The method of claim 21, wherein filtering comprises:

filtering the communication signal using a first cross coupled low pass filter and a second cross coupled low pass filter, the first cross coupled low pass filter including a first variable feedback resistor and the second cross coupled low pass filter including a second variable feedback resistor.

23. The method of claim 21, wherein causing comprises:

causing the adjustable filter to adjust the first variable feedback resistor and the second variable feedback resistor until the signal to noise ratio is sufficient to allow for measurement of the image rejection and the DC offset rejection of the filtered communication signal.

24. The method of claim 13, further comprising:

receiving the communication signal from a wireless communication channel.

* * * * *

UNITED STATES PATENT AND TRADEMARK OFFICE
CERTIFICATE OF CORRECTION

PATENT NO. : 8,675,777 B2  
APPLICATION NO. : 12/544486  
DATED : March 18, 2014  
INVENTOR(S) : Meng-An Pan Page 1 of 1

It is certified that error appears in the above-identified patent and that said Letters Patent is hereby corrected as shown below:

At Title Page, Related U.S. Application Data, Item (63), please replace "continuation of application" with --continuation-in-part of application--.

In the Claims:

At column 12, line 14, please replace "the DC, offset rejection" with --the DC offset rejection--.

At column 14, line 13, please replace "filter aril a" with --filter and a--.

Signed and Sealed this  
Seventeenth Day of June, 2014

Michelle K. Lee  
*Deputy Director of the United States Patent and Trademark Office*